United States Patent
Hsu et al.

(10) Patent No.: US 10,574,193 B2
(45) Date of Patent: Feb. 25, 2020

(54) CLASS AB AMPLIFIER HAVING CASCODE STAGE WITH FILTER FOR IMPROVING LINEARITY

(71) Applicant: MEDIATEK INC., Hsin-Chu (TW)

(72) Inventors: Jui-Yu Hsu, Taipei (TW); Yuan-Fu Lyu, Taoyuan (TW); Sheng-Hao Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 37 days.

(21) Appl. No.: 15/841,321

(22) Filed: Dec. 14, 2017

(65) Prior Publication Data

US 2018/0212572 A1    Jul. 26, 2018

Related U.S. Application Data

(60) Provisional application No. 62/450,104, filed on Jan. 25, 2017.

(51) Int. Cl.
*H03F 3/45* (2006.01)
*H03F 1/32* (2006.01)
(Continued)

(52) U.S. Cl.
CPC ........... *H03F 1/3211* (2013.01); *H03F 1/223* (2013.01); *H03F 3/21* (2013.01); *H03F 3/3023* (2013.01);
(Continued)

(58) Field of Classification Search
CPC .. H03F 1/3211; H03F 3/3023; H03F 3/45192; H03F 3/45219; H03F 3/21; H03F 1/223; H03F 3/4521; H03F 2203/45302; H03F 2203/45296; H03F 2203/45134; H03F 2200/168; H03F 2203/45298;
(Continued)

(56) References Cited

U.S. PATENT DOCUMENTS 5,786,731 A    7/1998 Bales
6,300,831 B1   10/2001 Xi
(Continued)

FOREIGN PATENT DOCUMENTS

CN    104428993 A    3/2015
TW    201105030 A1   2/2011

OTHER PUBLICATIONS

G. Espinosa-Flores-Verdad et al., Symmetrically compensated fully differential folded-cascode OTA, Electronics Letters, Sep. 16, 1999, vol. 35, No. 19, XP006012700.
(Continued)

*Primary Examiner* — Khanh V Nguyen
(74) *Attorney, Agent, or Firm* — Winston Hsu

(57) ABSTRACT

The present invention provides a class AB amplifier, wherein the class AB amplifier includes a cascode stage with a filter and an output stage. The cascode stage with the filter is arranged for receiving an input signal to generate a first driving signal and a second driving signal, wherein the filter filters the input signal to generate an filtered input signal, and at least one of the first driving signal and the second driving signal is generated according to the filtered input signal. The output stage is coupled to the cascode stage, and is arranged for generating an output signal according to the first driving signal and the second driving signal.

18 Claims, 6 Drawing Sheets

(51) Int. Cl.
  *H03F 3/21* (2006.01)
  *H03F 1/22* (2006.01)
  *H03F 3/30* (2006.01)
(52) U.S. Cl.
  CPC ....... *H03F 3/4521* (2013.01); *H03F 3/45192* (2013.01); *H03F 3/45219* (2013.01); *H03F 2200/165* (2013.01); *H03F 2200/168* (2013.01); *H03F 2203/45134* (2013.01); *H03F 2203/45296* (2013.01); *H03F 2203/45298* (2013.01); *H03F 2203/45302* (2013.01)
(58) Field of Classification Search
  CPC ...... H03F 2200/165; H03F 1/307; H03F 3/30; H03F 3/3001; H03F 3/3022; H03F 3/45; H03F 3/45183; H03F 2203/30009
  USPC .................................................. 330/253, 255
  See application file for complete search history.

(56) References Cited

U.S. PATENT DOCUMENTS

| | | | | |
|---|---|---|---|---|
| 7,414,473 | B1* | 8/2008 | Rayanakorn | H03F 1/483 330/255 |
| 8,890,610 | B2* | 11/2014 | Brantley | H03F 3/45192 330/254 |
| 8,890,611 | B2* | 11/2014 | Tsai | H03F 3/45076 330/255 |
| 2014/0097906 | A1 | 4/2014 | Jennings | |
| 2015/0381116 | A1* | 12/2015 | Wu | H03F 3/45179 330/253 |

OTHER PUBLICATIONS

Jose Silva-Martinez et al., Improving the High-Frequency Response of the Folded-Cascode Amplifiers, IEEE, May 12, 1996, pp. 500-503, XP000825623.

* cited by examiner

CLASS AB AMPLIFIER HAVING CASCODE STAGE WITH FILTER FOR IMPROVING LINEARITY

CROSS REFERENCE TO RELATED APPLICATIONS

This application claims the priority of U.S. Provisional Application No. 62/450,104, filed on Jan. 25, 2017, which is included herein by reference in its entirety.

BACKGROUND

A static class AB amplifier is widely used in filter design because of its good efficiency to drive load. However, the static class AB amplifier generally has a stage positioned before an output stage to set appropriate DC levels to the output stage, and because a transconductance and an output resistance of this stage vary with a signal swing, the variations of the transconductance and the output resistance will generate distortion. The distortion cannot be suppressed by loop gain at high frequency, meaning that a linearity of the class AB amplifier is dominated by the distortion/nonlinearity of this stage. In addition, because a third-order intermodulation distortion (IM3) has a strict requirement in Federal Communications Commission (FCC) specification, improving the distortion/nonlinearity of the class AB amplifier to meet the FCC requirement is important.

SUMMARY

It is therefore an object of the present invention to provide a class AB amplifier, which can reduce a high frequency distortion, to solve the above-mentioned problem.

According to one embodiment of the present invention, a class AB amplifier includes a cascode stage with a filter and an output stage. The cascode stage with the filter is arranged for receiving an input signal to generate a first driving signal and a second driving signal, wherein the filter filters the input signal to generate an filtered input signal, and at least one of the first driving signal and the second driving signal is generated according to the filtered input signal. The output stage is coupled to the cascode stage, and is arranged for generating an output signal according to the first driving signal and the second driving signal.

According to another embodiment of the present invention, a class AB amplifier includes an input stage, a cascode stage with a filter and an output stage. The input stage is arranged for receiving an input signal to generate an amplified input signal. The cascode stage with the filter is coupled to the input stage, and is arranged for receiving the amplified input signal to generate a first driving signal and a second driving signal, wherein the filter filters the amplified input signal to generate an filtered input signal, and at least one of the first driving signal and the second driving signal is generated according to the filtered input signal. The output stage is coupled to the cascode stage, and is arranged for generating an output signal according to the first driving signal and the second driving signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
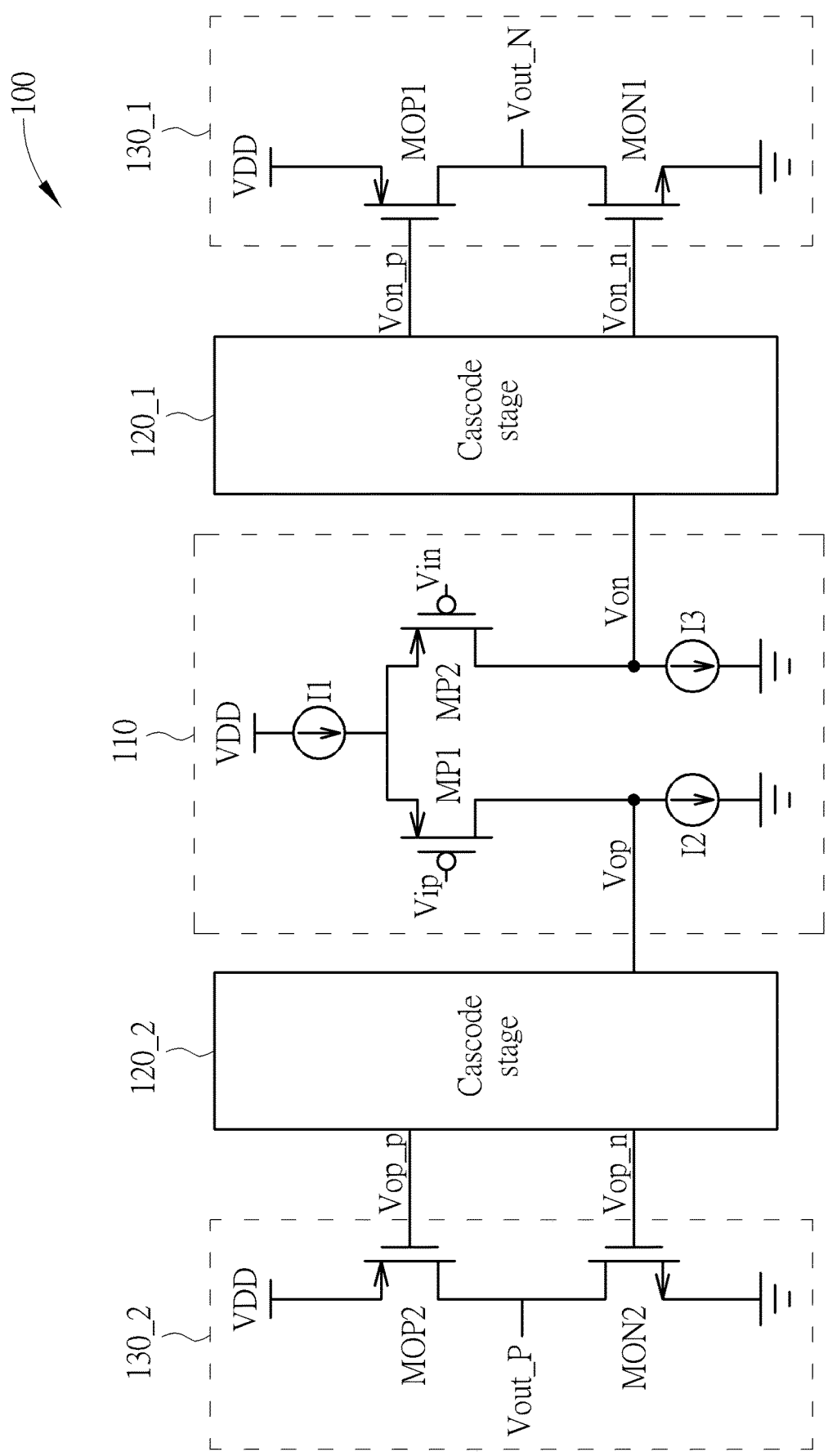
FIG. 1 is a diagram illustrating a class AB amplifier according to one embodiment of the present invention.

FIG. 1 is a diagram illustrating a class AB amplifier 100 according to one embodiment of the present invention. As shown in FIG. 1, the class AB amplifier 100 comprises an input stage 110, two cascode stages 120_1 and 120_2, and two output stages 130_1 and 130_2. In this embodiment, the class AB amplifier 100 is a static class AB amplifier, meaning that the class AB amplifier 100 always operates as class AB.

The input stage 110 comprises two P-type metal oxide semiconductor (PMOS) MP1 and MP2 and three current sources I1, I2 and I3, where the current source I1 is coupled between a supply voltage VDD and source electrodes of the PMOSs MP1 and MP2, and the current sources I2 and I3 are coupled between a ground voltage and drain electrodes of the PMOSs MP1 and MP2, respectively. The input stage 110 is arranged to receive differential input signals Vip and Vin to generate a differential amplified input signals Von and Vop. The cascode stage 120_1 is arranged to generate driving signals Von_p and Von_n according to the amplified input signal Von, and the cascode stage 120_2 is arranged to generate driving signals Vop_p and Vop_n according to the amplified input signal Vop. The output stage 130_1 comprises a PMOS MOP1 and an NMOS MON1, and is arranged to generate an output signal Vout_N according to the driving signals Von_p and Von_n; and the output stage 130_2 comprises a PMOS MOP2 and an NMOS MON2, and is arranged to generate an output signal Vout_P according to the driving signals Vop_p and Vop_n, wherein the output signals Vout_N and Vout_P are a differential pair.

Regarding the operations of the cascode stages 120_1 and 120_2, the cascode stage 120_1 is arranged to generate the driving signals Von_p and Von_n with appropriate DC levels to make the output stage 130_1 operate as a class AB output stage, and the cascode stage 120_1 further comprises a filter such as a high-pass filter to make the driving signals Von_p and Von_n have AC components of the amplified input signal Von. Similarly, the cascode stage 120_2 is arranged to generate the driving signals Vop_p and Vop_n with appropriate DC levels to make the output stage 130_2 operate as a class AB output stage, and the cascode stage 120_2 further comprises a filter such as a high-pass filter to make the driving signals Vop_p and Vop_n have AC components of the amplified input signal Von. By making the driving signals Von_p, Von_n, Vop_p and Vop_n have the AC components of the amplified input signals Von and Vop, gains of the output stage 130_1 and 130_2 are increased at high frequency, and the voltage swings of the amplified input signals Von and Vop can be reduced to improve the distortion/nonlinearity of the class AB amplifier 100.

Figure 2:
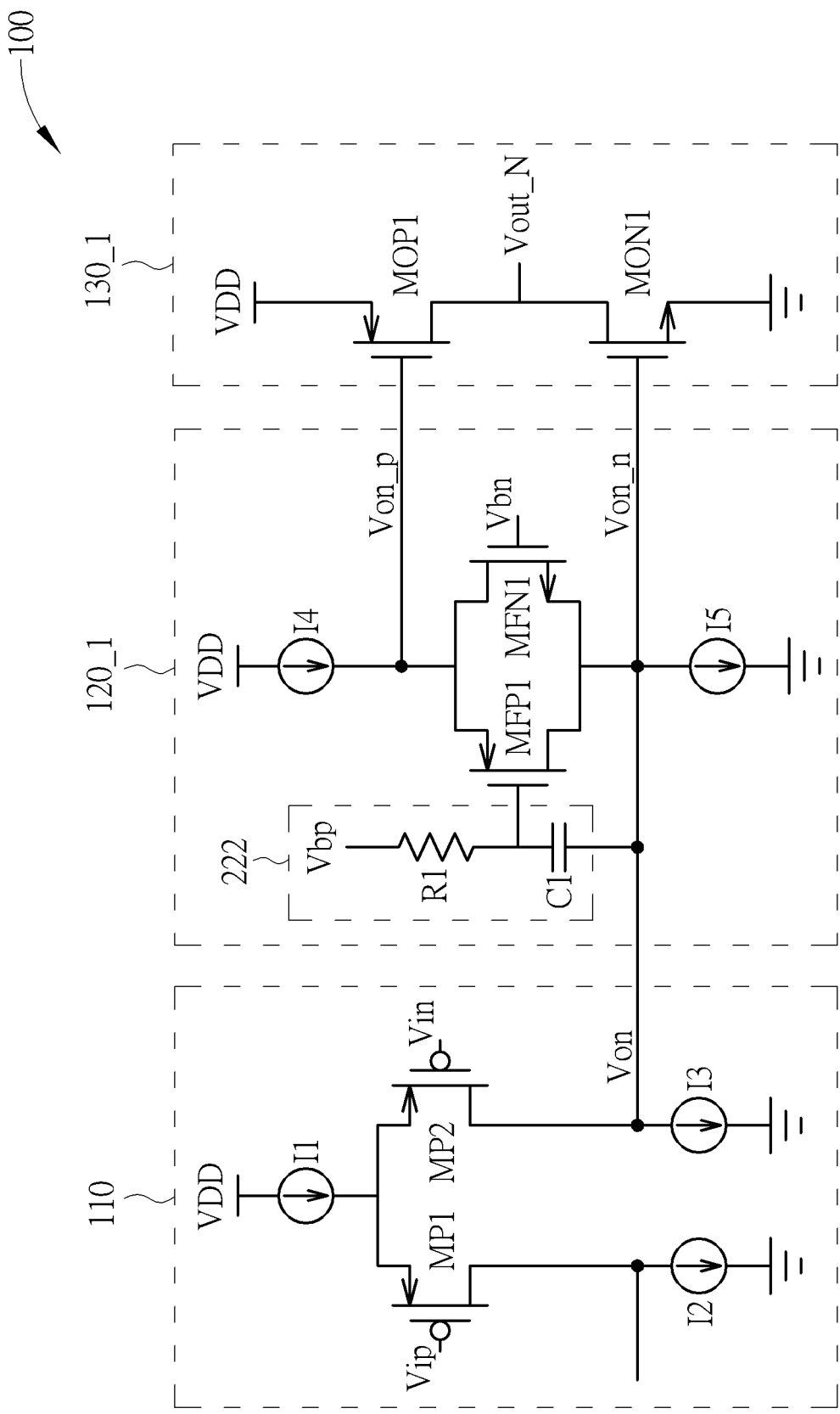
FIG. 2 is a diagram illustrating the cascode stage according to one embodiment of the present invention.

FIG. 2 is a diagram illustrating the cascode stage 120_1 according to one embodiment of the present invention. In the embodiment shown in FIG. 2, the cascode stage 120_1 comprises a high-pass filter 222, a PMOS MFP1, an NMOS MFN1, and two current sources I4 and I5, wherein the high-pass filter 222 comprises a capacitor C1 and a resistor R1. In the operations of the cascode stage 120_1 shown in FIG. 2, a gate electrode of the PMOS MFP1 is biased by a bias voltage Vbp divided by the resistor R1 and the capacitor C1, and a gate electrode of the NMOS MFN1 is biased by a bias voltage Vbn, and the PMOS MFP1 and the NMOS MFN1 are used to provide an appropriate DC offset to the driving signal Von_p to make the PMOS MOP1 of the output stage 130_1 operate in a saturation region; and the amplified input signal Von serves as the driving signal Von_n. In addition, when the amplified input signal Von has a high frequency, the high frequency AC component of the amplified input signal Von is allowed to be inputted into the gate electrode of the PMOS MFP1, and the PMOS MFP1 works as a source follower to make the driving signal Von_p have the high frequency AC component provided by the amplified input signal Von. Therefore, since the driving signal Von_p has the high frequency AC component provided by the amplified input signal Von at high frequency, the cascode stage 120_1 can be considered to provide additional gain to the output stage 130_1, and the voltage swing of the amplified input signals Von can be reduced, and the distortion/nonlinearity of the class AB amplifier 100 is improved due to the lower voltage swing of the amplified input signals Von.

In addition, because the linearity of the class AB amplifier 100 is good enough when the amplified input signals Von has low frequency, a corner of the high-pass filter 222 can be chosen at a higher frequency such as 40 MHz, and the resistor R1 and the capacitor C1 can be designed to be smaller to save the manufacturing cost.

The circuits shown in FIG. 2 are for illustrative purposes only, and they are not limitations of the present invention. For example, as long as the PMOS MFP1 can receive the high frequency AC component of the amplified input signal Von, the high-pass filter 222 may have other circuit designs or the high-pass filter 222 may be replaced by a band-pass filter. In addition, one or more transistors can be positioned between the current source I4 and the source electrodes of the PMOS MFP1 (drain electrode of the NMOS MFN1), one or more transistors can be positioned between the current source I5 and the drain electrode of the PMOS MFP1 (source electrode of the NMOS MFN1), one or more transistors can be positioned between the PMOS MOP1 and the supply voltage VDD, and/or one or more transistors are positioned between the NMOS MON1 and the ground voltage. These alternative designs shall fall within the scope of the present invention.

Figure 3:
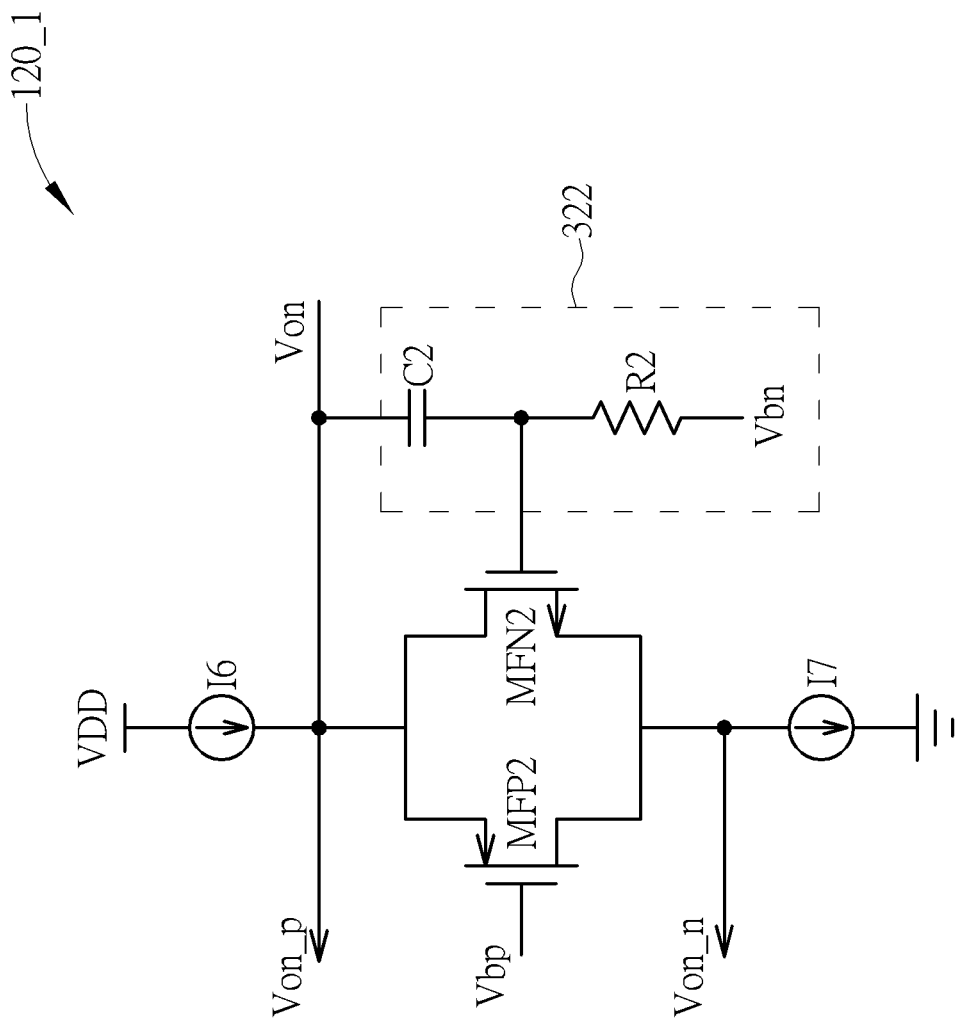
FIG. 3 is a diagram illustrating the cascode stage according to another embodiment of the present invention.

FIG. 3 is a diagram illustrating the cascode stage 120_1 according to another embodiment of the present invention. In the embodiment shown in FIG. 3, the cascode stage 120_1 comprises a high-pass filter 322, a PMOS MFP2, an NMOS MFN2, and two current sources I6 and I7, wherein the high-pass filter 322 comprises a capacitor C2 and a resistor R2. In the operations of the cascode stage 120_1 shown in FIG. 3, a gate electrode of the NMOS MFN2 is biased by a bias voltage Vbn divided by the resistor R2 and the capacitor C2, and a gate electrode of the PMOS MFP2 is biased by a bias voltage Vbp; and the amplified input signal Von serves as the driving signal Von_p. In addition, when the amplified input signal Von has a high frequency, the high frequency AC component of the amplified input signal Von is allowed to be inputted into the gate electrode of the NMOS MFN2, and the NMOS MFN2 works as a source follower to make the driving signal Von_n have the high frequency AC component provided by the amplified input signal Von. Therefore, since the driving signal Von_n has the high frequency AC component provided by the amplified input signal Von at high frequency, the cascode stage 120_1 can be considered to provide additional gain to the output stage 130_1, and the voltage swing of the amplified input signals Von can be reduced, and the distortion/nonlinearity of the class AB amplifier 100 is improved due to the lower voltage swing of the amplified input signals Von.

Figure 4:
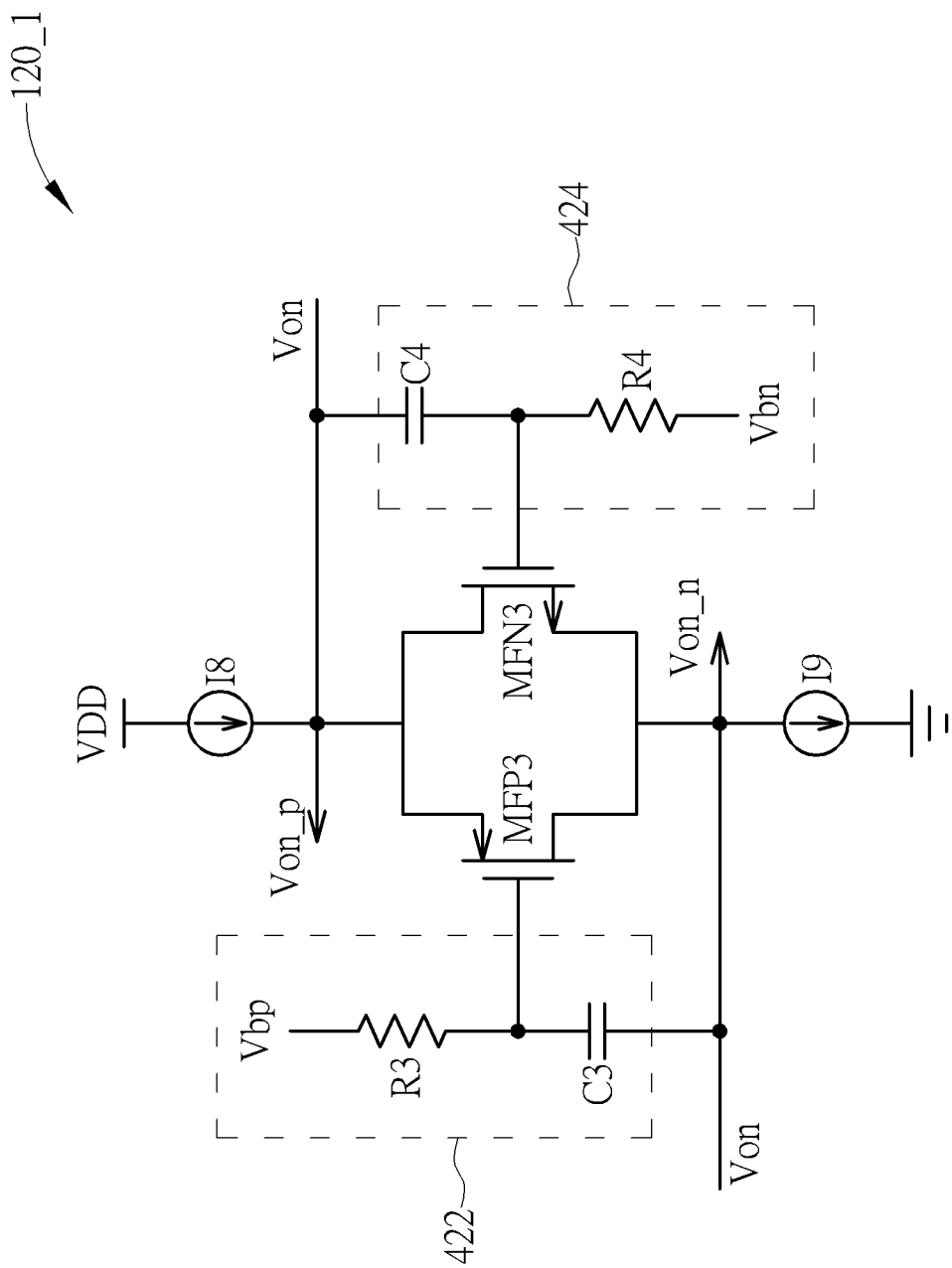
FIG. 4 is a diagram illustrating the cascode stage according to another embodiment of the present invention.

FIG. 4 is a diagram illustrating the cascode stage 120_1 according to another embodiment of the present invention. In the embodiment shown in FIG. 4, the cascode stage 120_1 comprises two high-pass filters 422 and 424, a PMOS MFP3, an NMOS MFN3, and two current sources I8 and I9, wherein the high-pass filter 422 comprises a capacitor C3 and a resistor R3, and the high-pass filter 424 comprises a capacitor C4 and a resistor R4. In the operations of the cascode stage 120_1 shown in FIG. 4, a gate electrode of the PMOS MFP3 is biased by a bias voltage Vbp divided by the resistor R3 and the capacitor C3, and a gate electrode of the NMOS MFN3 is biased by a bias voltage Vbn divided by the resistor R4 and the capacitor C4. The embodiment shown in FIG. 4 is a combination of the embodiments shown in FIG. 2 and FIG. 3, and similarly, the voltage swing of the amplified input signals Von shown in FIG. 4 can be reduced, and the distortion/nonlinearity of the class AB amplifier 100 is improved due to the lower voltage swing of the amplified input signals Von.

Figure 5:
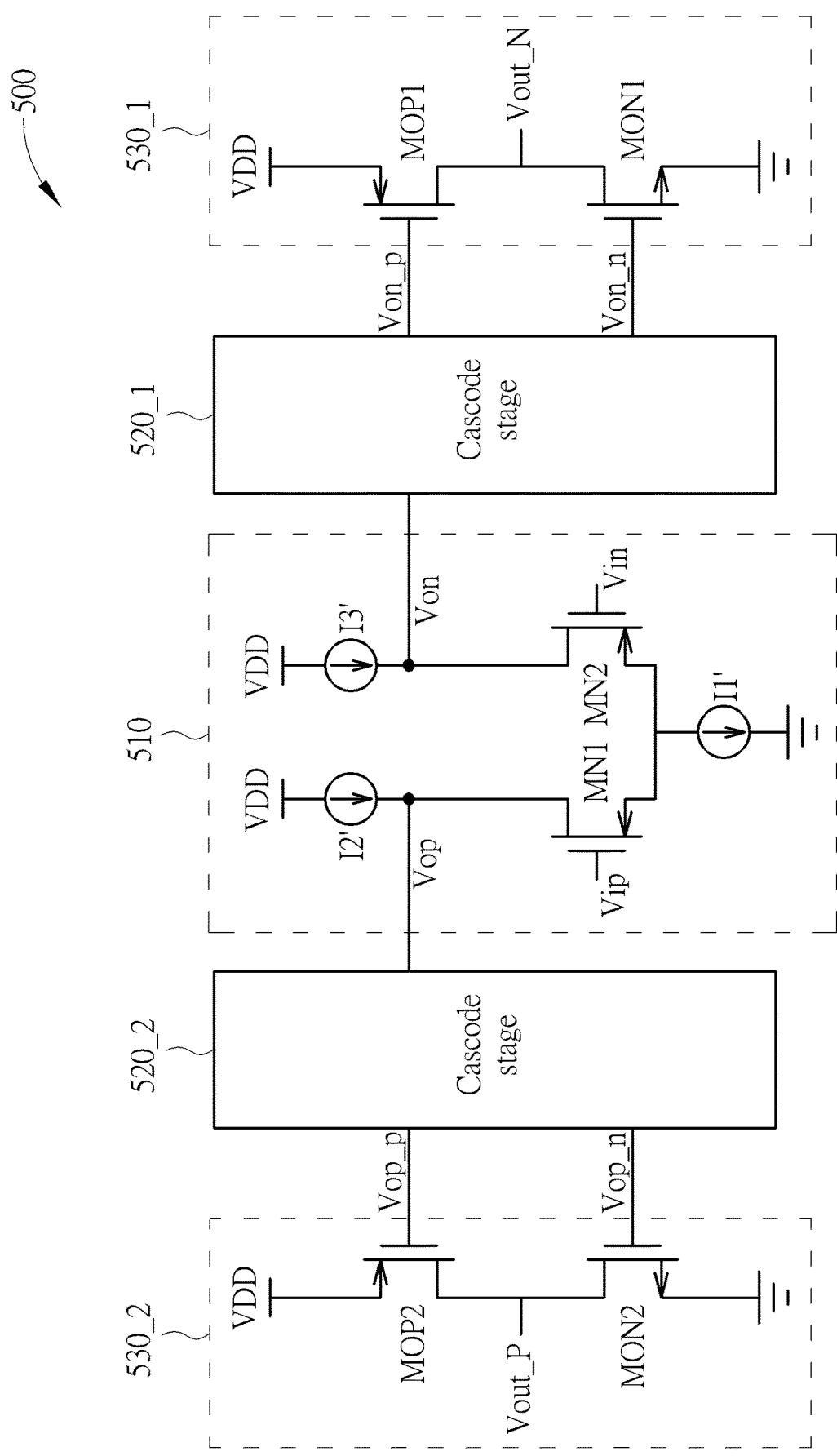
FIG. 5 is a diagram illustrating a class AB amplifier according to another embodiment of the present invention.

FIG. 5 is a diagram illustrating a class AB amplifier 500 according to another embodiment of the present invention. As shown in FIG. 5, the class AB amplifier 500 comprises an input stage 510, cascode stages 520_1 and 520_2, and output stages 530_1 and 530_2. In this embodiment, the class AB amplifier 500 is a static class AB amplifier, that is the class AB amplifier 500 is always operates as class AB.

The input stage 510 comprises two NMOS MN1 and MN2, and three current sources I1', I2' and I3', where the current source I1' is coupled between the ground voltage and source electrodes of the NMOSs MN1 and MN2, and the current sources I2' and I3' are coupled between the supply voltage VDD and drain electrodes of the NMOSs MN1 and MN2, respectively. The input stage 510 is arranged to receive differential input signals Vip and Vin to generate a differential amplified input signals Von and Vop. The cascode stage 520_1 is arranged to generate driving signals Von_p and Von_n according to the amplified input signal Von, and the cascode stage 5120_2 is arranged to generate driving signals Vop_p and Vop_n according to the amplified input signal Vop. The output stage 530_1 comprises a PMOS MOP1 and an NMOS MON1, and is arranged to generate an output signal Vout_N according to the driving signals Von_p and Von_n; and the output stage 530_2 comprises a PMOS MOP2 and an NMOS MON2, and is arranged to generate an output signal Vout_P according to the driving signals Vop_p and Vop_n, wherein the output signals Vout_N and Vout_P are a differential pair.

The class AB amplifier 500 is similar to the class AB amplifier 100 shown in FIG. 1 except for the input stage 510, and the operations and circuit designs of the cascode stages 520_1 and 520_2 may be implemented according to the embodiments shown in FIGS. 2-4. Further descriptions are therefore omitted here.

Figure 6:
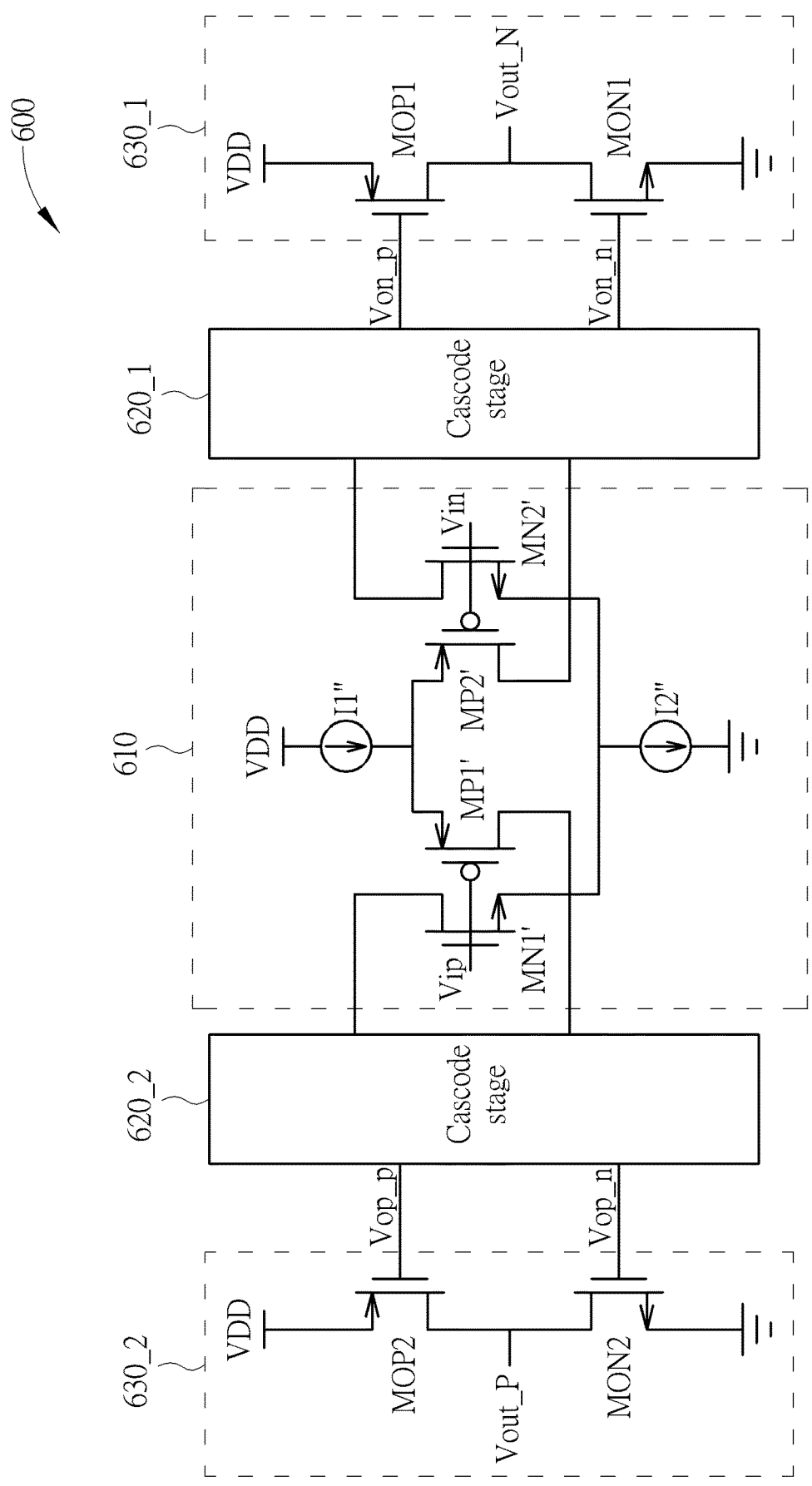
FIG. 6 is a diagram illustrating a class AB amplifier according to another embodiment of the present invention.

FIG. 6 is a diagram illustrating a class AB amplifier 600 according to another embodiment of the present invention. As shown in FIG. 6, the class AB amplifier 600 comprises an input stage 610, cascode stages 620_1 and 620_2, and output stages 630_1 and 630_2. In this embodiment, the class AB amplifier 600 is a static class AB amplifier, that is the class AB amplifier 600 is always operates as class AB.

The input stage 610 comprises two PMOSs MP1' and MP2', two NMOSs MN1' and MN2', and two current sources I1" and I2", where the current source I1" is coupled between the supply voltage VDD and source electrodes of the PMOSs MP1 and MP2, and the current source I2" is coupled between the ground voltage and source electrodes of the NMOSs MN1 and MN2. The input stage 610 is arranged to receive differential input signals Vip and Vin to generate a differential amplified input signals. The cascode stage 620_1 is arranged to generate driving signals Von_p and Von_n according to the amplified input signal, and the cascode stage 620_2 is arranged to generate driving signals Vop_p and Vop_n according to the amplified input signal. The output stage 630_1 comprises a PMOS MOP1 and an NMOS MON1, and is arranged to generate an output signal Vout_N according to the driving signals Von_p and Von_n; and the output stage 630_2 comprises a PMOS MOP2 and an NMOS MON2, and is arranged to generate an output signal Vout_P according to the driving signals Vop_p and Vop_n, wherein the output signals Vout_N and Vout_P are a differential pair.

The class AB amplifier 600 is similar to the embodiments shown in FIGS. 1 and 5 except for the input stage 610, wherein the input stage 610 is a complementary input stage comprising NMOS and PMOS. The operations and circuit designs of the cascode stages 620_1 and 620_2 may be implemented according to the embodiments shown in FIGS. 2-4. Further descriptions are therefore omitted here.

Briefly summarized, in the class AB amplifier of the present invention, by using a cascode stage with a high-pass filter, the AC component are inputted to a gate electrode of one or more transistors within the cascode stage to increase the gain of the class AB amplifier, and the voltage swing of signal at the cascode stage can be reduced, and the distortion/nonlinearity of the class AB amplifier is improved due to the lower voltage swing.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A class AB amplifier, comprising:
   a cascode stage with a filter, for receiving an amplified input signal from a previous stage to generate a first driving signal and a second driving signal; wherein the filter filters the amplified input signal to generate a filtered input signal, and at least one of the first driving signal and the second driving signal is generated according to the filtered input signal; and
   an output stage, coupled to the cascode stage, for generating an output signal according to the first driving signal and the second driving signal.

2. The class AB amplifier of claim 1, wherein the filter is a high-pass filter.

3. The class AB of claim 1, wherein both the first driving signal and the second driving signal comprise AC component of the amplified input signal.

4. The class AB amplifier of claim 1, wherein the cascode stage comprises:
   a P-type transistor, wherein the filtered input signal is inputted into a gate electrode of the P-type transistor to generate the first driving signal at a source electrode of the P-type transistor.

5. The class AB amplifier of claim 4, wherein the filter is a high-pass filter, and the filter comprises:
   a capacitor, coupled between the amplified input signal and the gate electrode of the P-type transistor; and
   a resistor, coupled between a bias voltage and the gate electrode of the P-type transistor.

6. The class AB amplifier of claim 4, wherein the output stage comprises a P-type output transistor and an N-type output transistor connected in cascode, wherein the P-type output transistor receives the first driving signal, and the N-type output transistor receives the amplified input signal serving as the second driving signal, to generate the output signal.

7. The class AB amplifier of claim 1, wherein the cascode stage comprises:
   an N-type transistor, wherein the filtered input signal is inputted into a gate electrode of the N-type transistor to generate the second driving signal at a source electrode of the N-type transistor.

8. The class AB amplifier of claim 7, wherein the filter is a high-pass filter, and the filter comprises:
   a capacitor, coupled between the amplified input signal and the gate electrode of the N-type transistor; and
   a resistor, coupled between a bias voltage and the gate electrode of the N-type transistor.

9. The class AB amplifier of claim 7, wherein the output stage comprises a P-type output transistor and an N-type output transistor connected in cascode, wherein the N-type output transistor receives the second driving signal, and the P-type output transistor receives the amplified input signal serving as the first driving signal, to generate the output signal.

10. The class AB amplifier of claim 1, wherein the cascode stage comprises:
    a P-type transistor, wherein the filtered input signal is inputted into a gate electrode of the P-type transistor to generate the first driving signal at a source electrode of the P-type transistor; and
    an N-type transistor, wherein the filtered input signal is further inputted into a gate electrode of the N-type transistor to generate the second driving signal at a source electrode of the N-type transistor.

11. The class AB amplifier of claim 10, wherein the filter comprises:
    a first capacitor, coupled between the amplified input signal and the gate electrode of the P-type transistor;
    a first resistor, coupled between a bias voltage and the gate electrode of the P-type transistor;
    a second capacitor, coupled between the amplified input signal and the gate electrode of the N-type transistor; and
    a second resistor, coupled between a bias voltage and the gate electrode of the N-type transistor.

12. The class AB amplifier of claim 10, wherein the output stage comprises a P-type output transistor and an N-type output transistor connected in cascode, wherein the P-type output transistor receives the first driving signal, and the N-type output transistor receives the second driving signal, to generate the output signal.

13. The class AB amplifier of claim 1, wherein the class AB amplifier is a static class AB amplifier.

14. A class AB amplifier, comprising:
- an input stage, for receiving an input signal to generate an amplified input signal;
- a cascode stage with a filter, coupled to the input stage, for receiving the amplified input signal to generate a first driving signal and a second driving signal; wherein the filter filters the amplified input signal to generate a filtered input signal, and at least one of the first driving signal and the second driving signal is generated according to the filtered input signal; and
- an output stage, coupled to the cascode stage with the filter, for generating an output signal according to the first driving signal and the second driving signal.

15. The class AB amplifier of claim 14, wherein the filter is a high-pass filter.

16. The class AB of claim 14, wherein both the first driving signal and the second driving signal comprise AC component of the amplified input signal.

17. The class AB amplifier of claim 14, wherein the cascode stage comprises:
- a P-type transistor, wherein the filtered input signal is inputted into a gate electrode of the P-type transistor to generate the first driving signal at a source electrode of the P-type transistor.

18. The class AB amplifier of claim 17, wherein the output stage comprises a P-type output transistor and an N-type output transistor connected in cascode, wherein the P-type output transistor receives the first driving signal, and the N-type output transistor receives the second driving signal, to generate the output signal.

* * * * *